United States Patent [19]

Petrangelo

[11] 4,015,745
[45] Apr. 5, 1977

[54] REUSABLE SEAL WITH THERMAL EXPANSION COMPENSATION

[75] Inventor: Amedio D. Petrangelo, Webster, N.Y.

[73] Assignee: Stromberg-Carlson Corporation, Rochester, N.Y.

[22] Filed: Sept. 22, 1975

[21] Appl. No.: 615,522

Related U.S. Application Data

[63] Continuation of Ser. No. 423,931, Dec. 12, 1973, abandoned.

[52] U.S. Cl. .............................. 220/320; 220/81 R
[51] Int. Cl.² ....................................... B65D 45/32
[58] Field of Search .......... 220/3.8, 80, 81 R, 225, 220/226, 217, 221, 228, 240, 308, 310, 319–328, 234, 236, 237, 238, 344, 357, 358

[56] References Cited

UNITED STATES PATENTS

| | | | |
|---|---|---|---|
| 1,963,675 | 6/1934 | Plainevaux | 220/320 |
| 2,075,383 | 3/1937 | Vaughn | 220/321 |
| 2,655,397 | 10/1953 | Augspurger | 220/321 |
| 2,715,477 | 8/1955 | North | 220/320 |
| 3,045,857 | 7/1962 | Lineweber | 220/81 R |
| 3,193,129 | 7/1965 | Pfluger | 220/240 |
| 3,283,348 | 11/1966 | Farmer | 220/81 R |
| 3,331,528 | 7/1967 | Racek | 220/319 |
| 3,388,823 | 6/1968 | Fleming | 220/81 R |
| 3,421,652 | 1/1969 | Warman | 220/320 |

Primary Examiner—Ro E. Hart
Attorney, Agent, or Firm—Hoffman Stone; William F. Porter, Jr.

[57] ABSTRACT

A container assembly for a telephone repeater or the like including a circular flat base of metal and a dome-like cover of plastic. The cover includes an outwardly extending, flared flange for engagement against a chamfered outer edge portion of the base. The flange is secured to the base by a V-groove ring, one wall of which defines, in conjunction with the chamfer of the base, an outwardly flared annular chamber for receiving the flared flange. An O-ring is seated in a groove in the chamfer of the base in pressure engagement against the flared flange of the cover.

The arrangement maintains an air tight seal between the cover and the base over a wide range of temperatures despite a difference between the thermal expansion characteristics of the metallic base and the plastic cover.

4 Claims, 5 Drawing Figures

REUSABLE SEAL WITH THERMAL EXPANSION COMPENSATION

This application is a continuation of application Ser. No. 423,931, filed Dec. 12, 1973, and now abandoned.

BRIEF DESCRIPTION

This invention relates to a novel sealable and resealable container having good weathering characteristics, and capable of maintaining its seal throughout a wide range of temperatures.

The invention arose in connection with efforts to improve the reliability and serviceability, and to reduce the cost of containers of the kind used to house telephone gear in the open weather, typically so-called repeater cases. It will be understood, however, that the invention is not so restricted, and is expected to find utilization in other fields as well.

The repeater cases heretofore in common use in the telephone industry comprise a metal base and a flanged metal cover. The cover flange is secured to the base with an O-ring interposed, and the cases are usually pressurized to prevent the entry of moisture or other contaminants from the ambient atmosphere. The base is usually fairly thick and does not present a problem. The cover, however, is commonly made of thin sheet metal and is subject to denting and corrosion. Also, the O-ring is placed under considerable pressure to ensure a tight seal, so that it flattens and must be replaced each time the case is opened and reclosed.

The present invention arose as a result of attempts to make the cover of plastic sheet material. It was found that economically available plastics has a greater thermal expansion characteristic than the metal, commonly steel or cast iron, of which the base was made, and sealing the plastic cover to the metallic base so that the seal was maintained throughout the wide range of temperatures encountered in service presented a serious problem.

In accordance with the invention the plastic cover is sealed to the base by a wedge shaped flange integral with the cover seated in a congruent chamber formed by the base and a V-groove ring. The cover expands and contracts relative to the base in response to changes of temperature, but only to a limited degree beyond which the plastic is compressed or stretched depending upon the direction of the temperature change. An O-ring is seated between the cover and the base in a groove which limits the compression upon it, avoiding permanent deformation, so that it may be re-used many times.

A fairly wide chamfer is formed around the outer edge of the base, which may be otherwise conventional in all respects, typically a disc of steel or iron. The cover is dome-shaped, and is provided with an outwardly extending, flared flange around its open end. (For convenience the assembly will be described herein with the base regarded as the bottom and the cover as the top.) The bottom of the flange conforms in its disposition relative to the horizontal with the angle of the chamfer of the base, and it rests on the chamfer. A V-groove ring secures the flange to the base, extending over the flange, around the outer edges of the flange and the base, and also under the base. The upper wall of the ring rests on the top of the flange. The chamfer of the base and the upper wall of the V-groove ring define an outwardly flared annular chamber generally congruent with the outwardly flared flange of the cover. An O-ring is seated in a groove in the chamfer, the groove being shallower than the thickness of the O-ring as required to allow sealing pressure without permanent deformation.

When the cover is assembled to the base at ordinary room temperature, the outer edge of the flange lies slightly inwardly of the outer edge of the base and does not come into contact with the outer wall portion of the V-groove ring, which is tightened to press the flange firmly against the chamfer. When, thereafter, the temperature rises, the flange expands faster than the base. It slides outwardly along the chamfer until it meets the outer wall portion of the V-groove ring, remaining always in pressure engagement with the chamfer because of the congruence between the flange and the annular chamber formed by the chamfer and the upper wall of the ring. Upon further increase in temperature, the flange is constricted against expansion relative to the base and it undergoes compression.

If, taking the opposite case, the temperature drops below ordinary room temperature, the flange contracts faster than the base and tends to withdraw from the annular chamber. As it does so, however, it undergoes compression because the thicker part of the flange is moving into the thinner part of the annular chamber in which it lies. It also stretches due to its restriction. The result is a seal that is maintained throughout a wide range of temperatures with a high degree of reliability, and without undue pressure on the O-ring.

Thus, the invention takes advantage of the resilience and elasticity of the plastic to provide a tight seal throughout a wide temperature range, typically −40° to +140° F., while still allowing enough freedom of motion of the cover flange relative to the base to avoid excessive stresses on the flange.

DETAILED DESCRIPTION

A representative embodiment of the invention will now be described in conjunction with the drawing, wherein.

Figure 1:
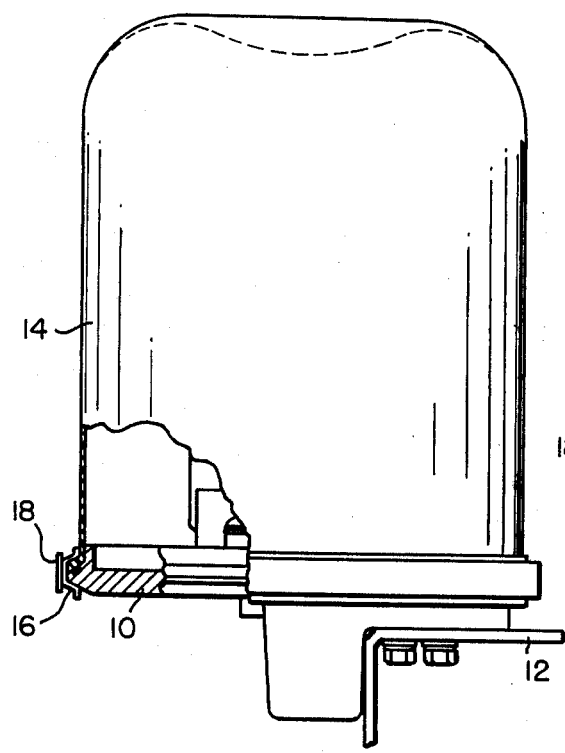
FIG. 1 is a side elevational view, with parts broken away, of a container according to the invention.

As shown, the container includes a base 10 secured to a bracket 12 for attaching it to a support such as a pole. A flanged cover 14 is secured to the base by a V-groove ring 16, which may be conventional in nature, typically consisting of three segments each covering a 120° arc and compressed inwardly around the base 10 by a band 18 and T-bolt assembly 20.

Figure 2:
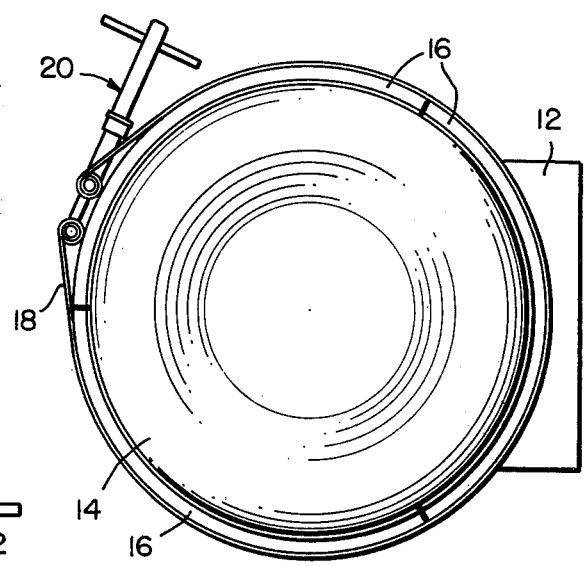
FIG. 2 is a plan view of the container shown in FIG. 1.
Figure 3:
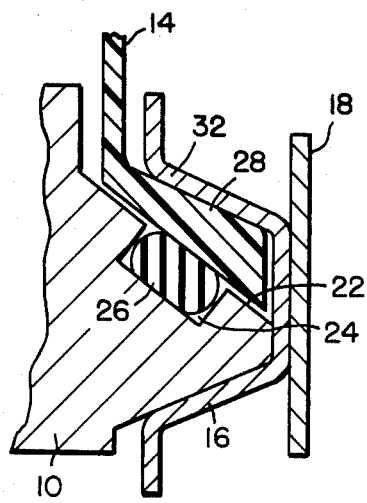
FIG. 3 is a fragmentary cross-sectional view of the container showing it assembled at an intermediate, design temperature.
Figure 4:
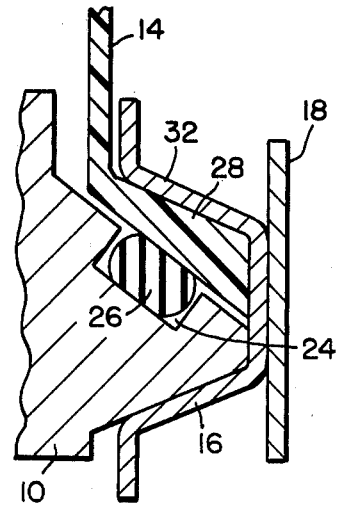
FIG. 4 is fragmentary, cross-sectional view sinilar to the view of FIG. 3 but showing the assembly at a temperature higher than the design temperature.
Figure 5:
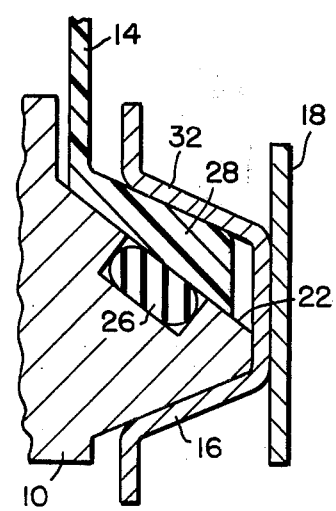
FIG. 5 is fragmentary, cross-sectional view similar to the view of FIG. 3 but showing the assembly at a low temperature.

Referring now to FIG. 2, a chamfer 22 extends around the outer, upper edge of the base 10, and an annular groove 24 is formed in the chamfer to accommodate an O-ring 26. A flange 28 integral with the main body of the cover 14 extends around the open end of the cover. The lower surface of the flange 28 lies parallel with the chamfer 22 when the cover is fitted upon the base. The flange 28 is flared outwardly, so that its outer edge is thicker than its inward parts. At ordinary room temperatures, so-called design temperature, the flange is of slightly smaller diameter than the base.

The V-groove ring is shaped to engage the bottom of the base 10 and its outer edge, and the upper wall 32 of the ring is shaped to conform to the upper surface of the flange 28, so that the annular chamber defined by the chamfer 22 and the upper wall 32 is generally congruent with the flange 28.

The cover 14 may be made of any of many different materials depending upon the designer's choice and service requirements. Since the container of the embodiment described herein is intended to house telephone repeater equipment, the material for it is chosen for good weathering ability, stability, and strength to withstand over-pressures within it. The exact cross-sectional shape of the flange 28 should be designed with its physical characteristics in mind to avoid excessive stressing of the flange as to both tension and compression. If, for example, the material cannot accept compression without ill effect, the flange 28 should be made small enough in diameter to avoid compression at the maximum temperature expected in service. Similarly, if the material will not withstand stretching at low temperatures, the flange should be made enough thinner than the chamber in which it is confined to accommodate its full contraction at the lowest temperature to be met in service. Satisfactory results have been achieved with covers made of fibreglass reinforced polyester resin, and of bis-phenyl polycarbonate. Materials such as Teflon and polyethylene are not presently thought desirable because of their cold flow, or creep characteristics.

What is claimed is:

1. A resealable container comprising a generally circular base of metal, a plastic cover fittable on said base for defining in conjunction therewith an enclosed chamber, an annular flange integral with said cover and extending radially outwardly therefrom at the end of the cover that is normally closed by the base, said flange being flared outwardly in thickness and its diameter at ordinary room temperature being slightly less than the diameter of the base, and a V-groove ring assembly for retaining the flange of said cover in engagement with the base, said V-groove ring being shaped to define in conjunction with a radially outer portion of the base a chamber generally congruent with said flange, said ring having a circumferential wall portion of approximately the same diameter as said base for restraining said flange from expanding outwardly beyond the edge of said base.

2. A sealable and resealable container comprising:
    a. a generally circular base of metal,
    b. a dome-like cover of plastic material shaped to fit upon said base,
    c. a radially outwardly extending flange integral with said cover at the open end thereof of approximately the same diameter as the base, said flange being outwardly flared in thickness,
    d. said base including an annular outer edge portion chamfered on both sides and having one surface angled to receive said flange in substantially parallel relationship to the mating surface thereof,
    e. an annular groove in said one surface of said outer portion of said base for receiving an O-ring and relieving it from excessive pressure when the flange is pressed against the base,
    f. an O-ring seated in said groove, and
    g. a V-groove ring for securing said flange against said base, said ring being shaped so that its surface that contacts the flange lies generally parallel with the contacted surface of the flange, said ring also having a circumferential wall portion of substantially the same diameter as said base for restraining said flange from expanding radially outwardly beyond the edge of said base.

3. A container according to claim 2 wherein the diameter of the flange at normal room temperature is slightly less than the diameter of the base, and the thermal expansion characteristic of the cover is significantly greater than the thermal expansion characteristic of the base, whereby the flange is retained between a wall of the V-groove ring and the base and is allowed limited motion relative to the base radially thereof in response to changes of temperature.

4. A container according to claim 3 wherein the base is chamfered around its outer edge, and the flange is angled relative to the dome-like body of the cover to lie flat upon the chamfer.

* * * * *